(12) United States Patent
Wall et al.

(10) Patent No.: US 8,184,686 B2
(45) Date of Patent: May 22, 2012

(54) SYSTEM AND METHOD FOR RECOVERING DATA RECEIVED OVER A COMMUNICATION CHANNEL

(75) Inventors: Brian Wall, Stittsville (CA); Stephane Dallaire, Gatineau (CA); Stephen Alie, Ottawa (CA); Kenji Suzuki, Kanata (CA)

(73) Assignee: Cortina Systems, Inc., Sunnyvale, CA (US)

( * ) Notice: Subject to any disclaimer, the term of this patent is extended or adjusted under 35 U.S.C. 154(b) by 1448 days.

(21) Appl. No.: 11/651,632

(22) Filed: Jan. 10, 2007

(65) Prior Publication Data

US 2008/0165841 A1  Jul. 10, 2008

(51) Int. Cl.
*H03H 7/30* (2006.01)
(52) U.S. Cl. ........ 375/232; 375/375; 375/376; 375/355; 375/233
(58) Field of Classification Search .................. 375/232
See application file for complete search history.

(56) References Cited

U.S. PATENT DOCUMENTS

| | | | | |
|---|---|---|---|---|
| 4,151,473 A * | 4/1979 | Coleman et al. | .......... | 327/8 |
| 4,535,459 A | 8/1985 | Hogge, Jr. | | |
| 5,345,476 A * | 9/1994 | Tsujimoto | .......... | 375/233 |
| 6,249,557 B1 * | 6/2001 | Takatori et al. | .......... | 375/355 |
| 6,633,201 B1 * | 10/2003 | Milton | .......... | 331/1 A |
| 7,151,814 B1 * | 12/2006 | Kong et al. | .......... | 375/376 |
| 2004/0048589 A1 * | 3/2004 | Yamamoto et al. | .......... | 455/130 |
| 2005/0135471 A1 * | 6/2005 | Tonietto et al. | .......... | 375/233 |
| 2005/0185742 A1 * | 8/2005 | Liu | .......... | 375/348 |

OTHER PUBLICATIONS

Beukema, Troy et al. "A 6.4-Gb/s CMOS SerDes Core With Feed-Forward and Decision-Feedback Equalization", *IEEE Journal of Solid-State Circuits*, 40(12):2633-2645, Dec. 2005.
Hu, Jiawen, "A Clock Recovery Circuit for Blind Equalization of Multi-Gbps Serial Data Links", *IEEE ISCAS*, pp. 5163-5166, Retrieved from the Internet on Sep. 17, 2006.
Hogge, Charles R., Jr., "A Self Correcting Clock Recovery Circuit", *IEEE Journal of Lightwave Technology*, Lt-3:1312-1314, Dec. 1985.
Lee, Edward A. et al., "Digital Communication", $2^{nd}$ Edition, Kluwer Academic Publishers Group, Chapter 11.3 Adaptive DFE, pp. 540-543, 1994.
Beomsup, Kim "PLL/Clock Recovery Techniques for Fast Local Area Networks", *ISSCC' 99 Short Course*, Feb. 1999.
Wu, Hui et al., "Integrated Transversal Equalizers in High-Speed Fiber-Optic Systems", *IEEE Journal of Solid-State Circuits*, 38(12)2131-2137, Dec. 2003.

* cited by examiner

*Primary Examiner* — Shuwang Liu
*Assistant Examiner* — Lihong Yu

(57) ABSTRACT

According to a first aspect, there is provided a circuit for recovering data received over a communication channel. The circuit includes an adaptive equalizer operable to remove ISI (intersymbol interference) from a received signal and a timing recovery circuit operable to sample recovered data. The timing recovery circuit includes a detector based on a Hogge Phase detector. According to another aspect, there is provided a module in which the circuit may be implemented. According to another aspect, there is provided a method for recovering data received over a communication channel. The method involves removing ISI from a received signal using an adaptive equalizer, and sampling recovered data using a detector based on a Hogge phase detector. According to another aspect, the timing recovery circuit includes a plurality of phase detectors, each one being operable to sample recovered data. A selector is provided for selecting which sampled recovered data is to be output.

22 Claims, 10 Drawing Sheets

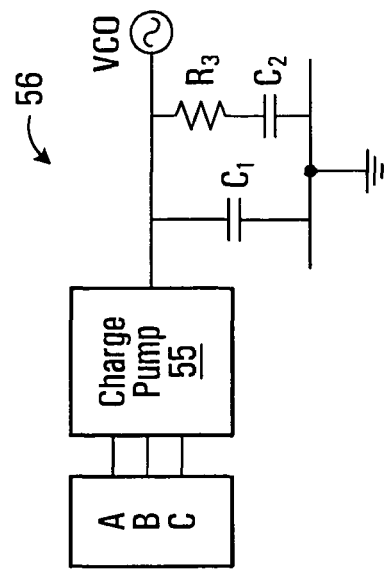
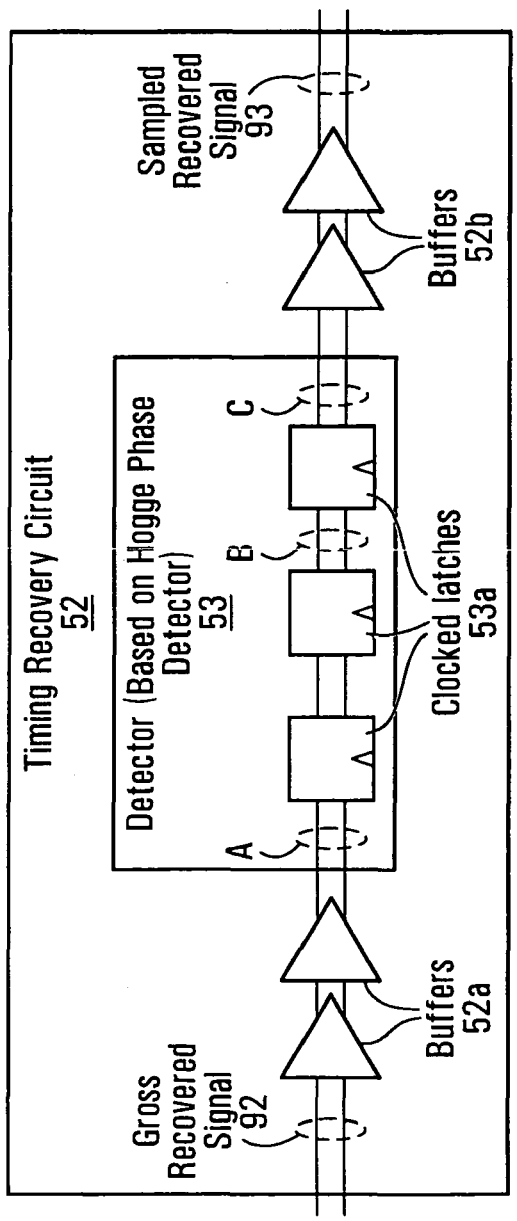
FIG. 5B
FIG. 5A

US 8,184,686 B2

SYSTEM AND METHOD FOR RECOVERING DATA RECEIVED OVER A COMMUNICATION CHANNEL

FIELD OF THE APPLICATION

The application relates to communication systems, and more particularly to recovering data received over a communication channel.

BACKGROUND

In the past, a motivation for deploying multimode fibre was its cheaper cost by comparison with single mode fibre. Unfortunately, multimode fibre has disadvantages over single mode fibre. In particular, signals traversing a multimode fibre will be dispersed or separated into a number of modes. Unfortunately, depending on the length of the multimode fibre, each mode may arrive at the destination at slightly different times. A receiver must compensate for this. Furthermore, the receiver must compensate for ISI (intersymbol interference) found in the received signal.

Recovering data received over a multimode fibre is accomplished using appropriate timing recovery. Many existing timing recovery circuits use a PLL (Phase Lock loop) to determine a proper sampling point. However, as data rates increase, existing timing recovery circuits are no longer adequate for properly recovering data received over multimode fibre. Adaptive equalization plus appropriate timing recovery circuits are used. An entire study group during the 802.3 aq standard was involved in characterizing this problem.

A possible approach is to replace existing multimode fibre with single-mode fibre. However, this approach is generally considered to be impractical because it can be very expensive. There is a very large installed base of multimode fibre. Accordingly, multimode fibre that has been deployed is likely to remain. Therefore, there exists a need for an improved circuit for recovering data received over a multimode fibre that can handle higher data rates.

SUMMARY OF THE APPLICATION

According to a broad aspect, there is provided a circuit for recovering data received over a communication channel, the circuit comprising: an adaptive equalizer operable to remove ISI (intersymbol interference) from a received signal so as to generate a gross recovered signal; and a timing recovery circuit operable to sample the gross recovered signal so as to generate a sampled recovered signal; wherein the timing recovery circuit comprises a detector based on a Hogge Phase detector for generating the sampled recovered signal.

According to another broad aspect, there is provided a module comprising: a laser receiver operable to receive data over a communication channel; the circuit summarised above operable to recover and sample the data; and an electrical interface operable to interface the module with some other circuit.

According to another broad aspect, there is provided a method for recovering data received over a communication channel, the method comprising: removing ISI (intersymbol interference) from a received signal using an adaptive equalizer so as to generate a gross recovered signal; and sampling the gross recovered signal using a circuit based on a Hogge phase detector so as to generate a sampled recovered signal.

According to another broad aspect, there is provided a circuit for recovering data received over a communication channel, the circuit comprising: an adaptive equalizer operable to remove ISI (intersymbol interference) from a received signal so as to generate a gross recovered signal; and a timing recovery circuit comprising a plurality of phase detectors, each phase detector being operable to sample the gross recovered signal so as to generate a respective sampled recovered signal; and a signal selector operable to select one respective sampled recovered signal based on a performance criterion, the one respective sampled recovered signal being selected to be an output of the circuit.

According to another broad aspect, there is provided a method for recovering data received over a communication channel, the method comprising: removing ISI (intersymbol interference) from a received signal using an adaptive equalizer so as to generate a gross recovered signal; sampling the gross recovered signal using each of a plurality of phase detectors so as to generate a plurality of respective sampled recovered signals; selecting one sampled recovered signal of the plurality of respective sampled recovered signals based on a performance criterion; and outputting the one sampled recovered signal

BRIEF DESCRIPTION OF THE DRAWINGS

Embodiments will now be described with reference to the attached drawings in which:

FIG. 5A is a schematic of an example timing recovery circuit;

FIG. 5B is a schematic of a circuit for generating another error signal;

DETAILED DESCRIPTION

Circuit for Recovering Data

Figure 1:
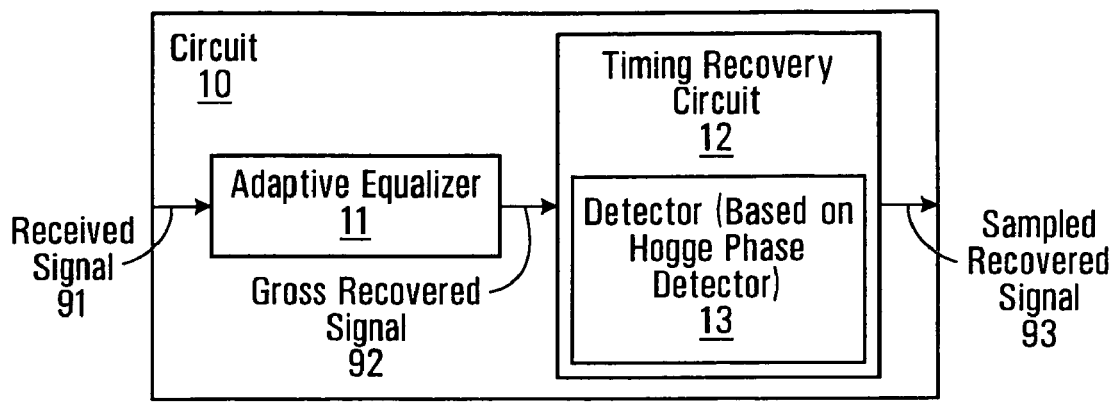
FIG. 1 is a block diagram of a circuit for recovering data received over a communication channel.

Referring now to FIG. 1, shown is a block diagram of a circuit 10 for recovering data received over a communication channel. The circuit 10 has an adaptive equalizer 11 coupled to a timing recovery circuit 12. The timing recovery circuit 12 has a detector 13 that is based on a Hogge Phase detector, for example the Hogge Phase detector described in U.S. Pat. No. 4,535,459, the disclosure of which is hereby incorporated by reference in its entirety. The circuit 10 may have other components, but they are not shown for sake of simplicity.

In operation, the adaptive equalizer 11 removes ISI (intersymbol interference) from a received signal 91 so as to generate a gross recovered signal 92. The timing recovery circuit 12 samples the gross recovered signal 92 so as to generate a sampled recovered signal 93. According to an embodiment of the application, the timing recovery circuit 12 samples the gross recovered signal 92 and generates the sampled recovered signal 93 using the detector 13 that is based on the Hogge Phase detector.

In some implementations, the detector 13 that is based on the Hogge phase detector is implemented in the analog domain so that it is continuous, very sensitive, and able to track incoming signals even if they are modulated with a fixed or variable frequency. This provides the detector 13 with good jitter tolerance. In some implementations, the detector 13 it is a linear phase detector so that it has better gain control over a range of sampling points within the eye. Other implementations are possible.

Figure 2:
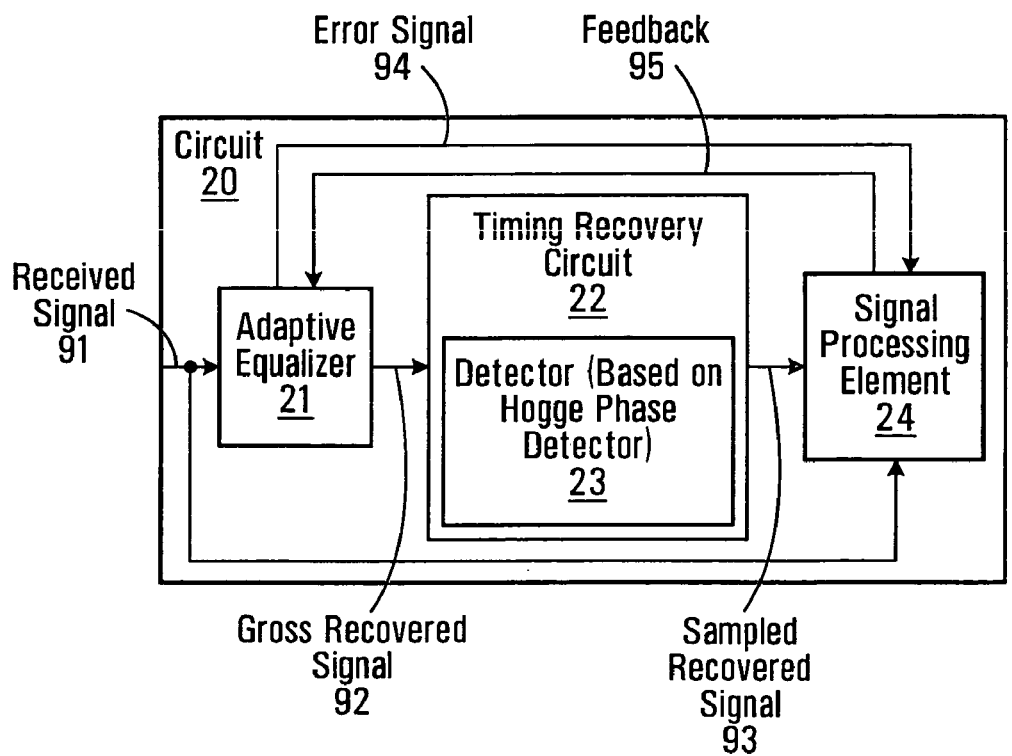
FIG. 2 is a block diagram of another circuit for recovering data received over a communication channel.
Figure 3:
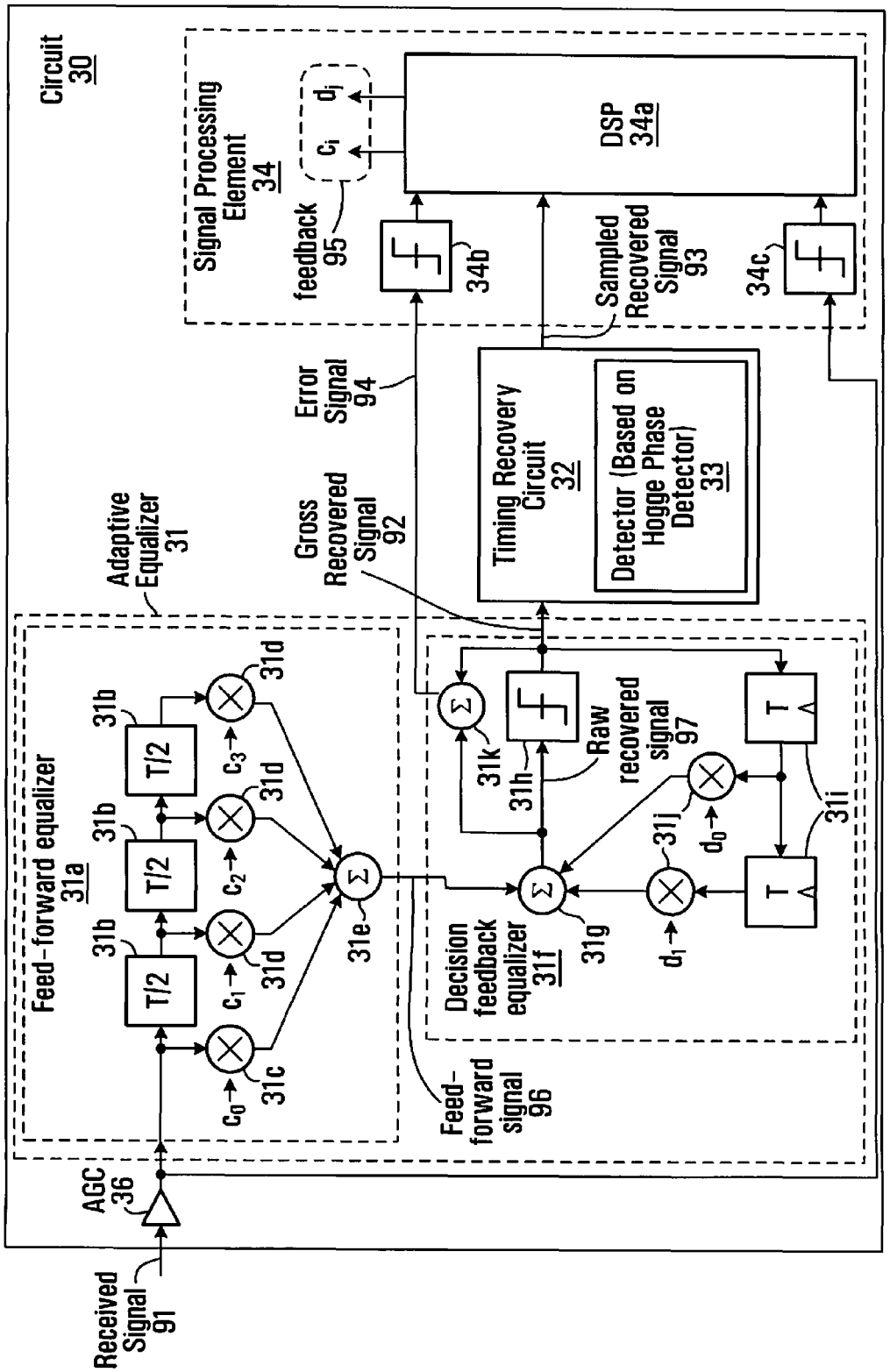
FIG. 3 is a block diagram of another circuit for recovering data received over a communication channel.

The circuit 10 is applicable to recovering data received over many different types of communication channels, for example a multimode fibre, a printed circuit board, a communication backplane, a coaxial cable, or any other appropriate communication channel. Subsequent examples provided with reference to FIGS. 2 and 3 are also applicable to recovering data received over many different types of communication channels. Implementations may vary depending on the type of communication channel over which the circuit receives the data. An example implementation particularly suited for recovering data received over a multimode fibre is provided below with reference to FIG. 6.

In some implementations, the circuit 10 includes circuitry for generating feedback for the adaptive equalizer 11. An example of how this might be implemented is provided below with reference to FIG. 2.

Referring now to FIG. 2, shown is a block diagram of another circuit 20 for recovering data received over a communication channel. The circuit 20 has an adaptive equalizer 21 coupled to a timing recovery circuit 22. The timing recovery circuit 22 has a detector 23 that is based on a Hogge Phase detector. The circuit 20 also has a signal processing element 24 coupled to the adaptive equalizer 21 and the timing recovery circuit 22. The circuit 20 may have other components, but they are not shown for sake of simplicity.

In operation, the adaptive equalizer 21 and the timing recovery circuit 22 operate much like the adaptive equalizer 11 of FIG. 1 and the timing recovery circuit 12 of FIG. 1, respectively. However, the adaptive equalizer 21 is further operable to generate an error signal 94 for the signal processing element 24. The signal processing element 24 implements an algorithm to minimize the error signal 94 by generating a feedback 95 for the adaptive equalizer 21. In the illustrated example, the signal processing element 24 generates the feedback 95 based on the received signal 91, the sampled recovered signal 93, and the error signal 94.

There are many possibilities for the signal processing element 24. In some implementations, the signal processing element 24 is a DSP (Digital Signal Processor). In other implementations, the signal processing element 24 is an FPGA (Field Programmable Gate Array). In other implementations, the signal processing element 24 is an ASIC (Application Specific Integrated Circuit). More generally, the signal processing element 24 may be any appropriately configured hardware component or any combination of appropriately configured hardware components.

There are many possibilities for the algorithm used to minimize the error signal 94. In some implementations, the algorithm is based on an LMS (Least Mean Square) algorithm. Other implementations are possible. There are other algorithms in the literature; however, LMS is relatively simple and widely used.

There are many possibilities for the feedback 95 generated by the signal processing element 24. In some implementations, the feedback 95 includes a set of coefficients for use by the adaptive equalizer 21. In other implementations, the feedback 95 includes a plurality of sets of coefficients for use by the adaptive equalizer 21. In some implementations, the nature of the feedback 95 is dependent upon the adaptive equalizer 21.

There are many possibilities for the adaptive equalizer 21. In some implementations, the adaptive equalizer 21 includes a fractional or baud rate feed-forward equalizer. In other implementations, the adaptive equalizer 21 includes a decision feedback equalizer. In other implementations, the adaptive equalizer 21 includes both a feed-forward equalizer and a decision feedback equalizer. An example implementation is described below with reference to FIG. 3.

Referring now to FIG. 3, shown is a block diagram of another circuit 30 for recovering data received over a communication channel. It is to be understood that the circuit 30 is shown with a very specific arrangement of components and is for example purposes only. The circuit 30 has an adaptive equalizer 31 coupled to a timing recovery circuit 32. The adaptive equalizer 31 includes a feed-forward equalizer 31a and a decision feedback equalizer 31f, details of which are described below. In some implementations, there are signal conditioning components, for example an AGC (Automatic Gain Control) 36 for adjusting the received signal 91 to an appropriate range for the adaptive equalizer 31. The timing recovery circuit 32 has a detector 33 that is based on a Hogge Phase detector. The circuit 30 also has a signal processing element 34 coupled to the adaptive equalizer 31 and the timing recovery circuit 32. The signal processing element 34 has a DSP 34a and a couple of threshold elements 34b, 34c. The circuit 20 may have other components, but they are not shown for sake of simplicity.

In operation, the adaptive equalizer 31, the timing recovery circuit 32, and the signal processing element 34 operate much like the adaptive equalizer 21, the timing recovery circuit 22, and the signal processing element 24, respectively, as shown in FIG. 2. However, the feedback 95 generated by the signal processing element 34 is generated by the DSP 34a in the form of a first set of coefficients, $c_i$, and a second set of coefficients, $d_j$. The feed-forward equalizer 31a uses the first set of coefficients and the received signal 91 to generate a feed-forward signal 96. Further details of the feed-forward equalizer 31a are provided below. The decision feedback equalizer 31f uses the feed-forward signal 96 and the second set of coefficients to generate the gross recovered signal 92. The decision feedback equalizer 31f also generates the error signal 94. Further details of the decision feedback equalizer 31f are provided below.

In the illustrated example, the DSP 34a implements an algorithm based on the LMS algorithm for minimizing the error signal 94 by dynamically adjusting the first set of coefficients and the second set of coefficients. The second set of coefficients are updated based on past values of the second set of coefficients according to $$d_{jT+1} = d_{jT} + (\mu \cdot \text{sign}(\epsilon_T) \cdot \text{sign}(\text{data}_{T-j})), \quad [1]$$

where $\mu$ is a number between 0 and 1, $\epsilon_T$ is the error signal 94, and $\text{data}_{T-j}$ is the sampled recovered signal 93. In the illustrated example, the threshold element 34b implements the sign function for the error signal 94 while the timing recovery circuit 32 implements the sign function for the sampled recovered signal 93. The first set of coefficients are similarly updated based on past values for the first set of coefficients according to $$c_{i_{T+1}} = c_{ij} + (\mu \cdot \text{sign}(\epsilon_T) \cdot \text{sign}(x_{T-i})), \quad [2]$$

where x is the received signal 91 input to the feed-forward equalizer 31a. In the illustrated example, the threshold element 34c implements the sign function for the received signal 91.

The equations above use sign functions, which differ from the traditional LMS algorithm. Implementing sign functions, which have only two possible logical outputs, simplifies computation for the DSP 34a. However, in other implementations, other types of DACs (Digital to Analog Converters) with more than two possible logical outputs may be implemented so that the DSP 34 may perform computation with many possible discrete values for signals such as the error signal 94 or the received signal 91.

There are many operating conditions for the DSP 34a. In specific implementations, the DSP 34a is parallelized to operate at 1/32 times 10 GHz. However, more generally, the DSP 34a may operate under any suitable conditions for computing the first set of coefficients and the second set of coefficients.

Referring now to the feed-forward equalizer 31a, there are three analog delay elements 31b, four multipliers including a first multiplier 31c and three additional multipliers 31d, and a summation element 31e. The feed-forward equalizer 31a may have other components, but they are not shown for sake of simplicity.

In operation, the three analog delay elements 31b generate three time-delayed signals from the received signal 91. The first multiplier 31c generates a first multiplied signal by multiplying the received signal 91 with a first coefficient, $c_0$, of the first set of coefficients, $c_i$. Each additional multiplier 31d generates a respective multiplied signal by multiplying a respective one of the time-delayed signals with a respective one of the first set of coefficients, $c_i$. The summation element 31e generates the feed-forward signal 96 by summing the first multiplied signal with each respective multiplied signal.

It is to be understood that the feed-forward equalizer 31a is shown with a very specific arrangement of components and that other implementations are possible. Although three analog delay elements 31b and four multipliers 31c, 31d are shown, more generally, any appropriate number of analog delay elements 31b and multipliers 31c, 31d may be implemented. For example, in another implementation, the feed-forward equalizer 31a has one analog delay element 31b and two multipliers 31c, 31d. In other implementations, the feed-forward equalizer 31a is provided with more analog delay elements 31b and more multipliers 31c, 31d than that shown. Other implementations are possible.

In the illustrated example, each analog delay element 31b is a fractional analog delay element. Accordingly, the feed-forward equalizer 31a is a fractional feed-forward equalizer. However, in other implementations, the analog delay elements 31b are baud rate or baud period delay elements in which case the feed-forward equalizer 31a is a baud rate feed-forward equalizer.

Referring now to the decision feedback equalizer 31f, there is a first summation element 31g, a threshold element 31h, two clocked flip-flops 31i, two multipliers 31j, and a second summation element 31k. The decision feedback equalizer 31f may have other components, but they are not shown for sake of simplicity.

In operation, the first summation element 31g generates a raw recovered signal 97 by summing the feed-forward signal 96 with each of two multiplied signals. The threshold element 31h thresholds the raw recovered signal 97 thereby generating the gross recovered signal 92. The two clocked flip-flops 31i generate two time-delayed signals from the gross recovered signal 92. Each multiplier 31j generates a respective one of the two multiplied signals by multiplying a respective one of the two time-delayed signals with a respective one of the second set of coefficients, $d_j$. The second summation element 31k generates the error signal 94 by summing the raw recovered signal 97 with the gross recovered signal 92. Other implementations of the error signal are possible.

It is to be understood that the decision feedback equalizer 31f is shown with a very specific arrangement of components and that other implementations are possible. Although two clocked flip-flops 31i and two multipliers 31j are shown, more generally, any appropriate number of clocked flip-flops 31i and multipliers 31j may be implemented. For example, in another implementation, the decision feedback equalizer 31f has one clocked flip-flop 31i and one multiplier 31j. In other implementations, the decision feedback equalizer 31f is provided with more clocked flip-flops 31i and more multipliers 31j than that shown. Other implementations are possible.

There are many ways to implement the components of the feed-forward equalizer 31a and the decision feedback equalizer 31f. An example implementation of a decision feedback equalizer is described below with reference to FIG. 4.

Figure 4:
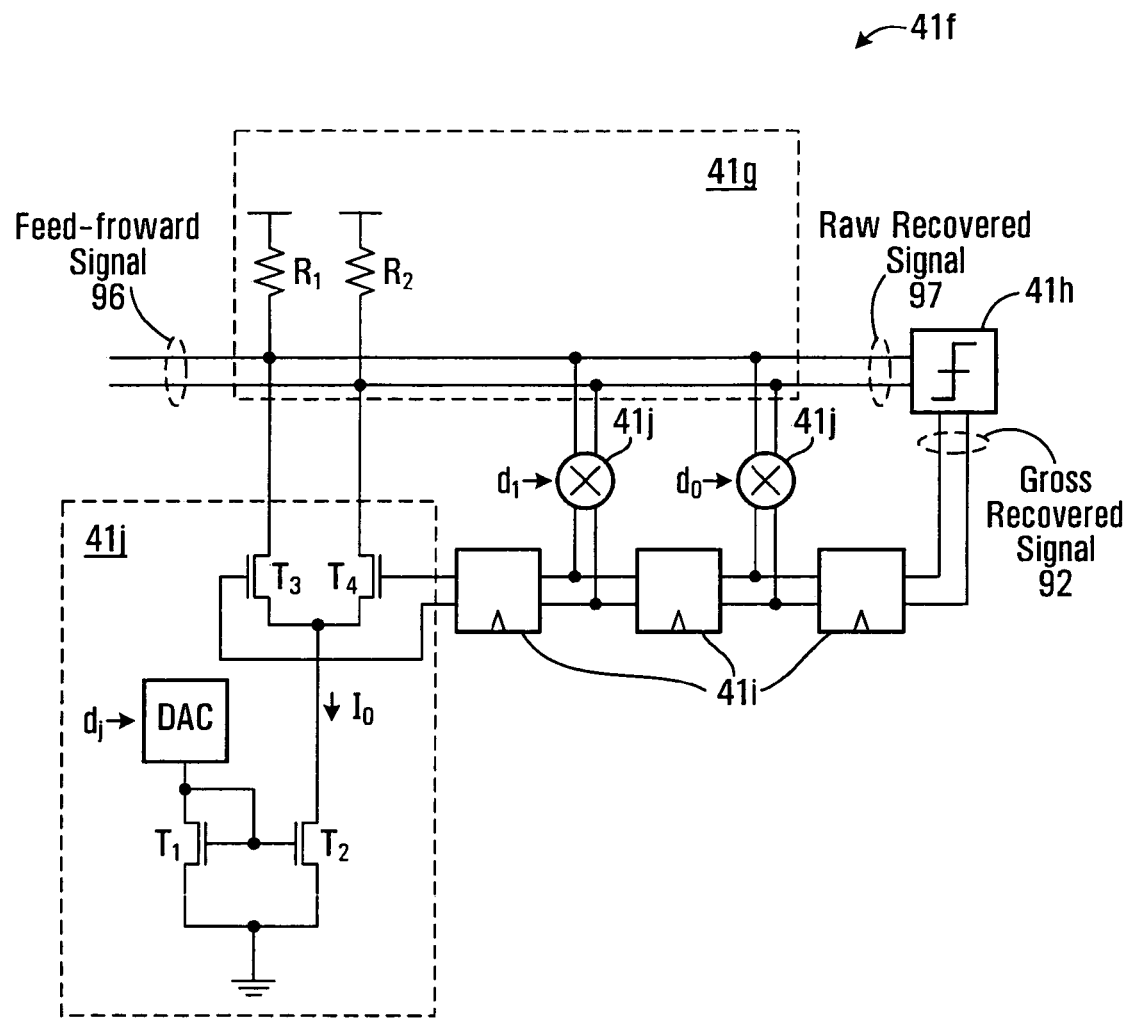
FIG. 4 is a schematic of an example implementation of a decision feedback equalizer.

Referring now to FIG. 4, shown is a schematic of an example implementation of a decision feedback equalizer 41f. It is to be understood that the decision feedback equalizer 41f is shown with a very specific arrangement of components and is for example purposes only. Much like the decision feedback equalizer 31f of FIG. 3, the decision feedback equalizer 41f has a summation element 41g, a threshold element 41h, a plurality of clocked flip-flops 41i, and a plurality of multipliers 41j. The decision feedback equalizer 41f may also have a second summation element (not shown) similar to the second summation element 31k shown in FIG. 3. However, the components are shown in FIG. 3 with a specific implementation in which components such as the multipliers 41j are implemented with differential components. Therefore, signals such as the feed-forward signal 96, the raw recovered signal 97, and the gross recovered signal 92 are shown as differential signals.

Only one of the multipliers 41j is shown with details, as the other multipliers 41j are assumed to be similar. Each multiplier 41j has analog components; however, the second set of coefficients, $d_j$, are assumed to come from a digital source such as the DSP 34a shown in FIG. 3. Therefore, each multiplier 41j converts its respective coefficient, $d_j$, into analog form using a DAC (Digital to Analog Converter). The DAC is a current DAC, which operates as a current source. A pair of FETS (Field Effect Transistors) $T_1$, $T_2$ are connected so as to form a current mirror for generating a current $I_0$ that is approximately proportional to the respective coefficient, $d_j$. A differential pair of FETS $T_3$, $T_4$ control how much of the current $I_0$ is drawn over a first resistor $R_1$ and a second resistor $R_2$ thereby determining in part the voltage of the raw recovered signal 97. The differential pair of FETS $T_3$, $T_4$ are driven by the output of the respective clocked flip-flop 41i. Therefore, the output of each multiplier 41j is approximately proportional to the respective coefficient, $d_j$, and the output of the respective clocked flip-flop 41i. The combination of each multiplier 41j determines the voltage of the raw recovered signal 97, as the combination of currents traversing the resistors $R_1$ and $R_2$ from each multiplier 41j determines the voltage of the raw recovered signal 97. In this way, the pair of resistors $R_1$, $R_2$ operate like a summation element.

In the illustrated example, the current $I_0$ is shown with a direction towards ground potential. The current $I_0$ is positive when the coefficient $d_j$ is positive. However, there may be instances when the coefficient $d_j$ is negative. Accordingly, in some implementations there is provided circuitry for generating a negative current for $I_0$. In some implementations, there is provided circuitry with the ability to reverse the polarity of the current $I_0$ based on the sign of the coefficient $d_j$. There are many ways to implement the change in polarity In the examples described above with reference to FIGS. 1 through 3, the timing recovery circuits 12, 22, 32 have been briefly described, while specific implementation details have not. An example of how such a timing recovery circuit may be implemented is described below with reference to FIG. 5A.

Referring now to FIG. 5A, shown is a schematic of an example timing recovery circuit 52. It is to be understood that the timing recovery circuit 52 is shown with a specific arrangement of components and is for example purposes only. The timing recovery circuit 52 has a detector 53 that is based on a Hogge Phase detector. The detector 53 has three clocked latches 53a connected in series. A first one of the three clocked latches has an input for accepting the gross recovered signal 92, while a last one of the three clocked latches has an output for the sampled recovered signal 93. The timing recovery circuit may have buffers, such as the buffers 52a on the input and buffers 52b on the output.

In operation, the three clocked latches 53a are operable to sample the gross recovered signal 92 so as to generate the sampled recovered signal 93 at the output of the last one of the three clocked flip-flops. The latches 53a used to sample the data are the same latches used to implement the CDR function. This can reduce power consumption by comparison to designs having separate circuitry for sampling the data and for implementing the CDR function.

In the illustrated example, the timing recovery circuit 52 is implemented in the analog domain so that it is continuous, very sensitive, and able to track incoming signals even if they are modulated with a fixed or variable frequency. This provides the timing recovery circuit 52 with good jitter tolerance. The timing recovery circuit 52 is a linear phase detector so that it has better gain control over a range of sampling points within the eye.

In the illustrated example, three clocked latches 53a are shown. However, more generally, the detector 53 may be provided with any appropriate number of clocked latches. In some implementations, the detector 53 is provided with other components. However, as shown in the illustrated example, the detector 53 may consist of only three clocked latches 53a. Other implementations are possible In some implementations, three sample points are collected as indicated at A, B, and C. The sample points may for example be used to generate a phase error signal. An example of how this may be accomplished is provided below with reference to FIG. 5B.

Referring now to FIG. 5B, shown is a schematic of a circuit 56 for generating a phase error signal. The circuit 56 has a charge pump 55 that is coupled to the sampled points A, B, and C. The charge pump 55 has an output connected to a filter. The filter has a first capacitor $C_1$ in parallel with a series combination of a resistor $R_3$ and a second capacitor $C_2$. The filter has an output to a VCO (voltage controlled oscillator). The circuit 56 may have other components, but they are not shown for sake of simplicity.

In operation, the charge pump 55 drives the filter as a function of the sampled points A, B, and C. The output of the filter drives the VCO, and is representative of a phase error. In some implementations, the timing recovery circuit 52 uses the phase error as a feedback signal to determine an appropriate sampling point. For example, the phase error might be used as feedback to control the sampling phase of the first latch of the clocked latches 53a. By minimizing the phase error, an appropriate sampling point in the data eye is chosen. In some implementations, the charge pump 56 is provided with logic used to determine the phase error. The output of the charge pump 56 goes to the integrating cap to filter the charge pump signal and then feed to the VCO.

For the purpose of providing further explanation, a specific example in which a phase error is used by a PLL (Phase Locked Loop) in order to generate an appropriate clock signal for flip-flops and/or latches of a detector that is based on a Hogge Phase detector is provided below with reference to FIG. 6A.

Figure 6A:
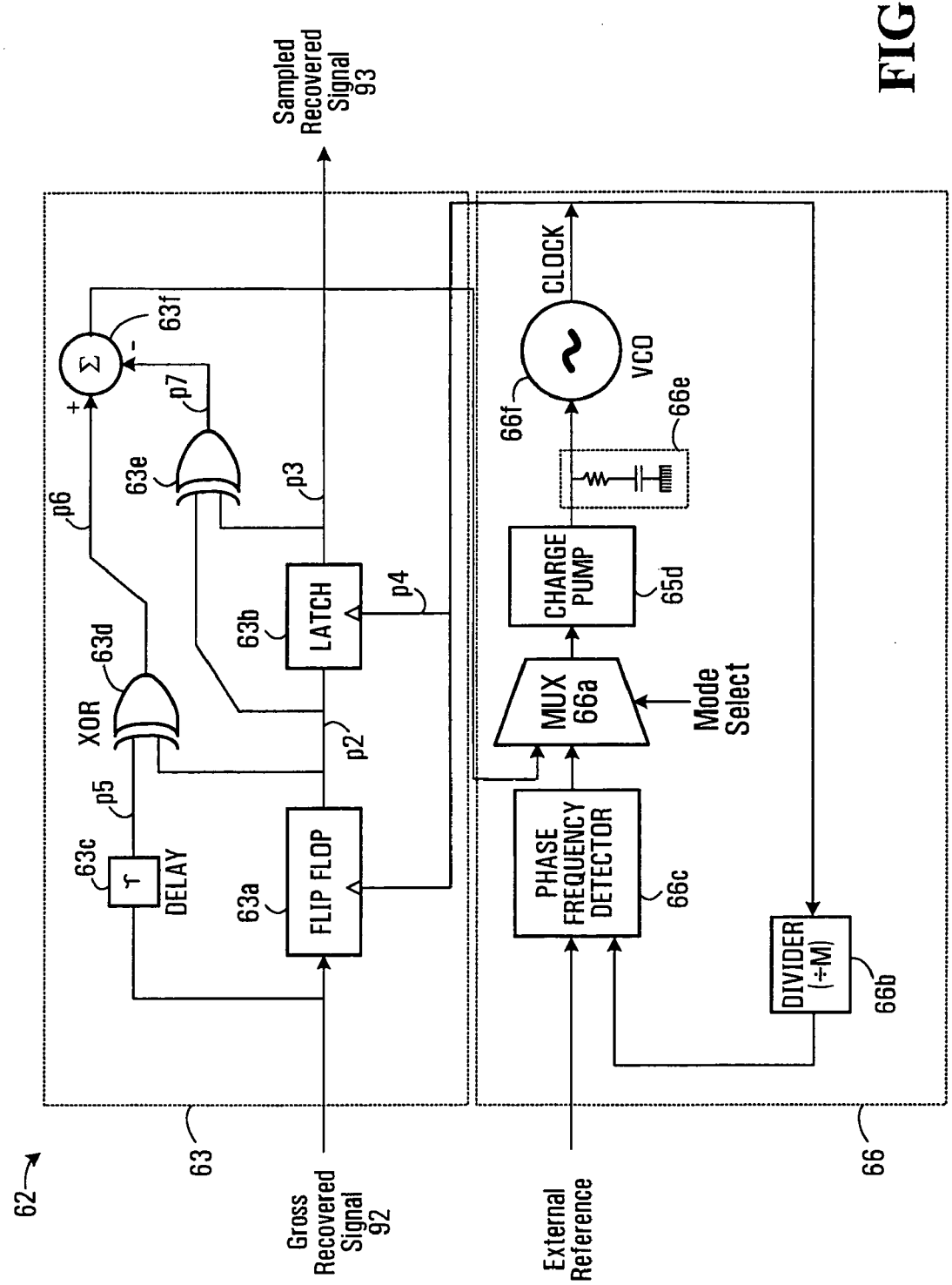
FIG. 6A is a schematic of another example timing recovery circuit 62.

Referring now to FIG. 6A, shown is a schematic of another example timing recovery circuit 62. It is to be understood that the timing recovery circuit 62 is shown with a very specific arrangement of components and is for example purposes only. The top portion of the timing recovery circuit 62 is a phase detector 63 and is implemented using a modified Hogge phase detector. The bottom part of the timing recovery circuit 62 is a PLL 66. The phase detector 63 takes the gross recovered signal 92 and inputs this to a flip flop 63a and also to a delay element 63c. The outputs of the flip flop 63a and the delay element 63c are fed into a first XOR circuit 63d. The output of the flip-flop 63a is also fed to a latch circuit 63b. The input and output of the latch circuit 63b are both fed to a second XOR gate 63e. The flip flop 63a and latch circuit 63b are both clocked by an output of the PLL 66, this being the clock signal from the VCO 66f. The output of the latch circuit 63b is the sampled recovered signal 93. The output of the second XOR gate 63e is subtracted from the output from the first XOR gate 63d with subtractor 63f. The output of subtractor 63f is representative of a phase error and is used by the PLL for generating the clock signal.

The PLL 66 has a charge pump 66d and filter 66e, the output of which drives a local oscillator (VCO) 66f. The output of the VCO 66f is a regenerated clock signal, which is fed to the phase detector 63. The charge pump 66d is driven by either a phase frequency detector 66c during a CDR frequency mode, or by the subtractor 63f during an operation mode. In the illustrated example, a multiplexer 66a performs selection between the phase frequency detector 66c and the subtractor 63f depending on the mode. In other implementations, alternative selection circuitry may be employed.

Initialisation of the clock signal occurs during the CDR frequency mode. Therefore, an external reference for the clock signal is used. The ratio between the frequencies of the clock signal from the VCO 66f, which is fed back around to the phase frequency detector 66c via a divider 66b, and the external reference is determined by the product of N×M. If M is one, then the divider 66b would not be needed. In the example in which the external reference is 161.11 MHz and the local clock is 10.3125 GHz, the ratio is 64. N and M are integer multiples and might for example be set to 4 and 16 respectively. Other values can be employed for the clocks.

After the CDR frequency mode, the multiplexer 66a selects the output of the subtractor 63f. As noted above, the output of the subtractor 63f is representative of a phase error. The combination of the charge pump 65d and the filter 66e drive the VCO 66f according to the phase error. The phase error decreases through proper adjustment of the clock signal generated by the VCO 66f until it stabilises at a point where the phase error is relatively low.

Figure 6B:
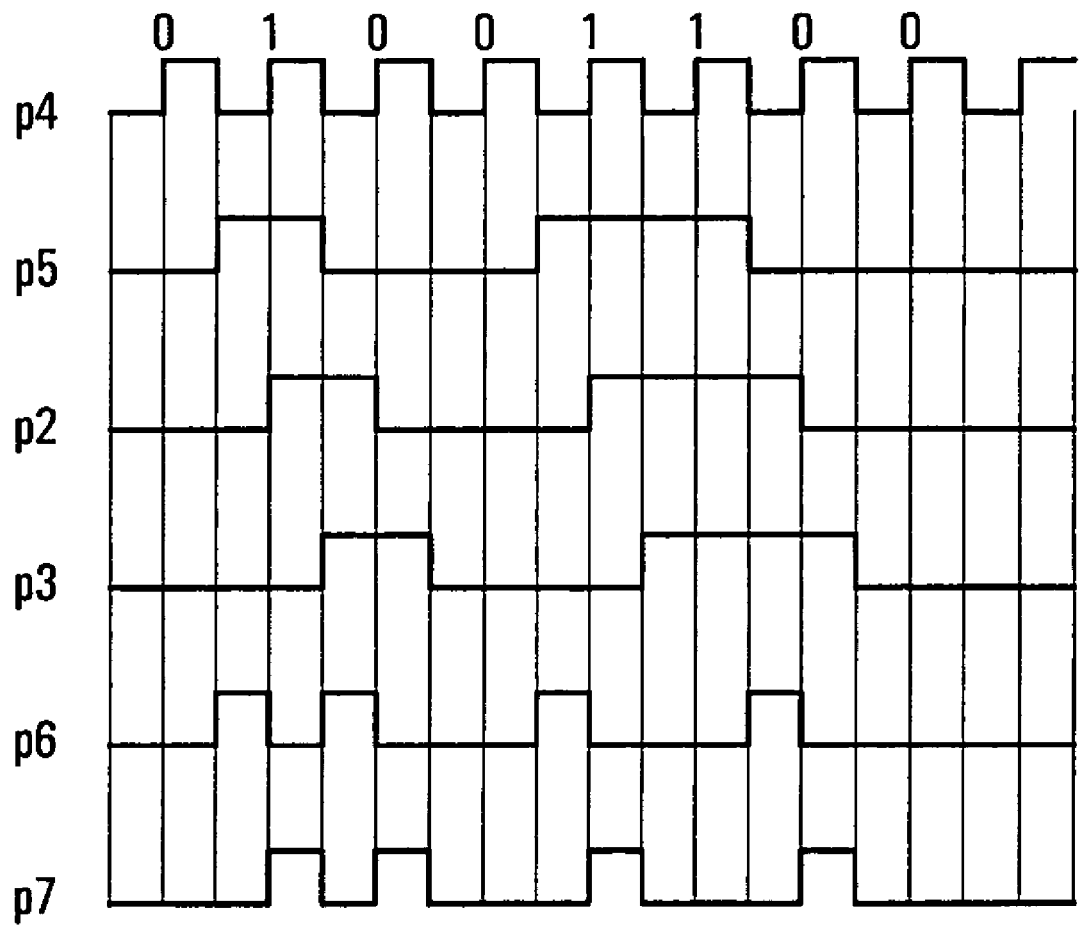
FIG. 6B is a signalling diagram showing example signalling that might be produced by the timing recovery circuit of FIG. 6A.

FIG. 6B is a signalling diagram showing example signalling that might be produced by the timing recovery circuit 62 of FIG. 6A. The signalling diagram includes signals that might be produced at points p2, p3, p4, p5, p6, and p7 of the phase detector 63.

Module for the Circuit

Figure 7:
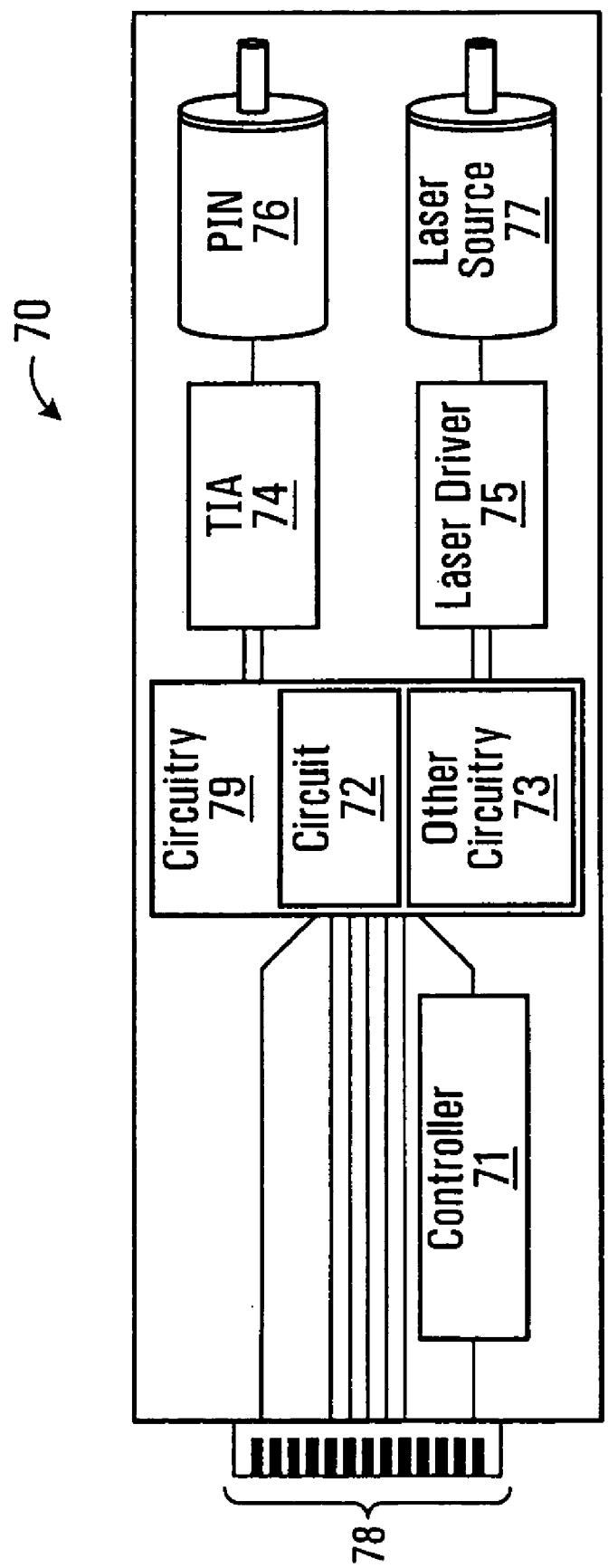
FIG. 7 is a schematic of a module implementing a circuit for recovering data received over a communication fibre.

Referring now to FIG. 7, shown is a schematic of a module 70 implementing a circuit 72 for recovering data received over a multimode fibre channel. The module 70 has an electrical interface 78 coupled to circuitry 79. The circuitry 79 includes the circuit 72 for recovering data received over a multimode channel. The circuitry 79 may also contain other circuitry 73. The circuitry 79 is coupled to a TIA (Trans-Impedance Amplifier) 74, which in turn is coupled to a PIN (p-type, intrinsic, n-type) photo diode 76. The circuitry 79 is also coupled to a laser driver 73, which in turn is coupled to a laser source 77. The module 70 also has a controller 71. The module 70 may have other components, but they are not shown for sake of simplicity.

In operation, the PIN 76 and the TIA operate to receive data over a multimode channel and convert the optical signal to an electrical signal. The circuit 72 operates to recover and sample the data. Examples of how this may be accomplished have been provided above. The controller 71 operates to verify that the module is working properly. The electrical interface 78 operates to interface the module 70 with some other circuit (not shown). The laser driver 75 and the laser source 77 operate to transmit a laser signal over a fibre channel.

In the illustrated example, the module 70 is shown with the TIA 74 and the PIN 76. The PIN 76 converts the received signal, which is in an optical form, into an electrical form. However, this is optional. More generally, in other implementations, the module 70 is provided with a laser receiver operable to receive data over a communication channel. Even more generally, in other implementations, the module 70 is provided with any appropriate receiver for receiving data over a communication channel.

In the illustrated example, the module 70 is shown with the laser driver 75 and the laser source 77. In other implementations, the module 70 does not have these components, as the module 70 is configured to receive data, but not transmit data.

In the illustrated example, the TIA 74, the PIN 76, the laser driver 75, and the laser source 77 are provided in a module together with the circuitry 79. In other implementations, the TIA 74, the PIN 76, the laser driver 75, and the laser source 77 are provided in a module while the circuitry 79 is provided separately on a board that the module plugs into (i.e. SFP+ application).

As noted above, the examples provided herein are applicable to recovering data received over many different types of communication channels. The different types of communication channels may for example include multimode fibres, communication printed circuit boards, communication backplanes, coaxial cables, or any other appropriate communication channels. Implementations may vary depending on the type of communication channel. For example, for the case of coaxial cable, the adaptive equalizer plus hogge phase detector might be placed inside an electrical module (i.e. no laser or photo diode). In this case, the module would generate an electrical signal that would be sent over the coaxial cable and would also recover an electrical signal sent from another electrical module.

Method for Recovering Data

Figure 8:
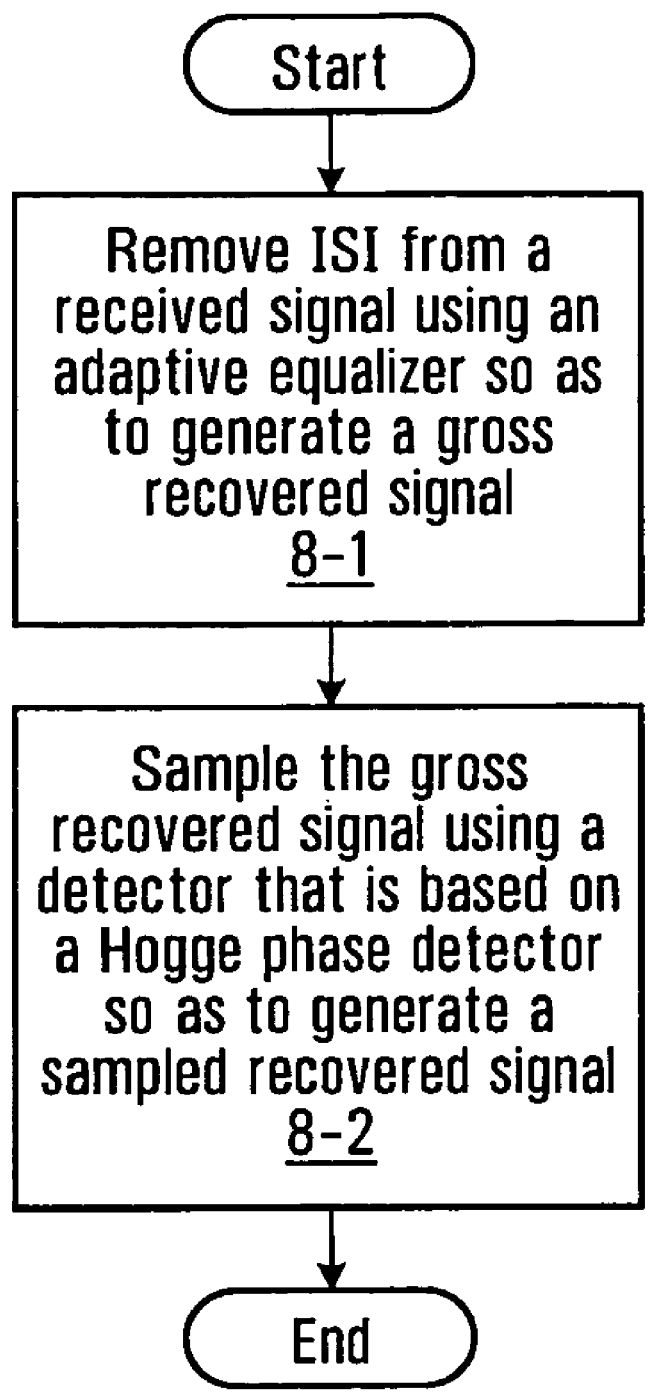
FIG. 8 is a flowchart of a method of recovering data received over a communication channel.

Referring now to FIG. 8, shown is a flowchart of a method of recovering data received over a communication channel. This method may be implemented by any appropriately configured circuit, for example the circuit 10 shown in FIG. 1, the circuit 20 shown in FIG. 2, the circuit 30 shown in FIG. 3, or the circuit 72 shown in FIG. 7. At step 8-1, the circuit removes ISI from a received signal using an adaptive equalizer so as to generate a gross recovered signal. At step 8-2, the circuit samples the gross recovered signal using a detector that is based on a Hogge phase detector so as to generate a sampled recovered signal.

Another Circuit for Recovering Data

In the examples presented above, it is assumed that there is a single phase detector. In such examples, the output of the circuit is assumed equal to or derived from the output of the single detector. In another embodiment, there is provided one or more additional phase detectors, each one having a respective output. In this embodiment, one of the respective outputs is selected as the output of the circuit. An example is provided below with reference to FIG. 9.

Figure 9:
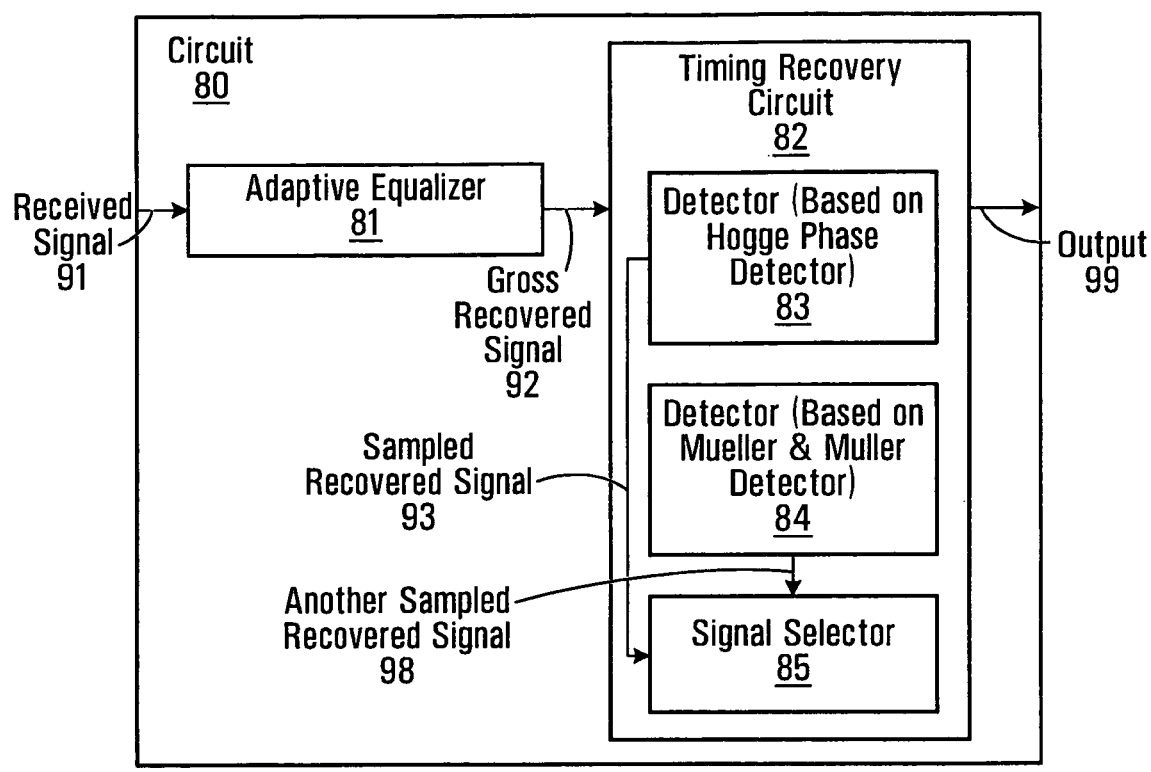
FIG. 9 is a block diagram of another circuit for recovering data received over a communication channel.

Referring now to FIG. 9 is a block diagram of another circuit 80 for recovering data received over a communication channel. The circuit 80 has an adaptive equalizer 81 coupled to a timing recovery circuit 82. The timing recovery circuit 82 has a first detector 83 that is based on the Hogge Phase detector, a second detector 84 that is based on a Mueller and Muller Phase detector, and a signal selector 85. The circuit 80 may have other components, but they are not shown for sake of simplicity.

In operation, the adaptive equalizer 81 removes ISI (intersymbol interference) from a received signal 91 so as to generate a gross recovered signal 92. The first detector 83 samples the gross recovered signal 92 so as to generate a sampled recovered signal 93. The second detector similarly samples the gross recovered signal 92 so as to generate another sampled recovered signal 98. The sampled recovered signal 93 of the first detector 83 together with the sampled recovered signal 98 of the second detector 84 form a plurality of selectable sampled recovered signals 93, 98. According to an embodiment of the application, the signal selector 85 is operable to select one sampled recovered signal of the plurality of selectable sampled recovered signals 93, 98 according to a performance criterion. The one sampled recovered signal is selected to be an output 99 of the circuit 80.

There are many possibilities for the performance criterion. In some implementations, the performance criterion is BER (Bit Error Rate) of each selectable sampled recovered signal 93, 98. In this implementation, the selectable sampled recovered signal 93, 98 having the smallest BER is selected as the output 99. The signal selector 85 might be provided with any appropriate circuitry for determining BER, for example a protocol machine. In other implementations, the performance criterion is SNR (Signal to Noise Ratio) of each selectable sampled recovered signal 93, 98. In this implementation, the selectable sampled recovered signal 93, 98 having the greatest SNR is selected as the output 99. The signal selector 85 might be provided with any appropriate circuitry for a determining SNR, for example circuitry for determining the SNR based on LMS error. In other implementations, the signal selector 85 performs selection based on both the BER and the SNR of each selectable sampled recovered signal. Other implementations are possible.

In the illustrated example, the timing recovery circuit 82 has detectors 83, 84 that are each based on specific designs. More generally, the timing recovery circuit 82 may be provided with a plurality of phase detectors, each phase detector being of any appropriate design.

Another Method for Recovering Data

Figure 10:
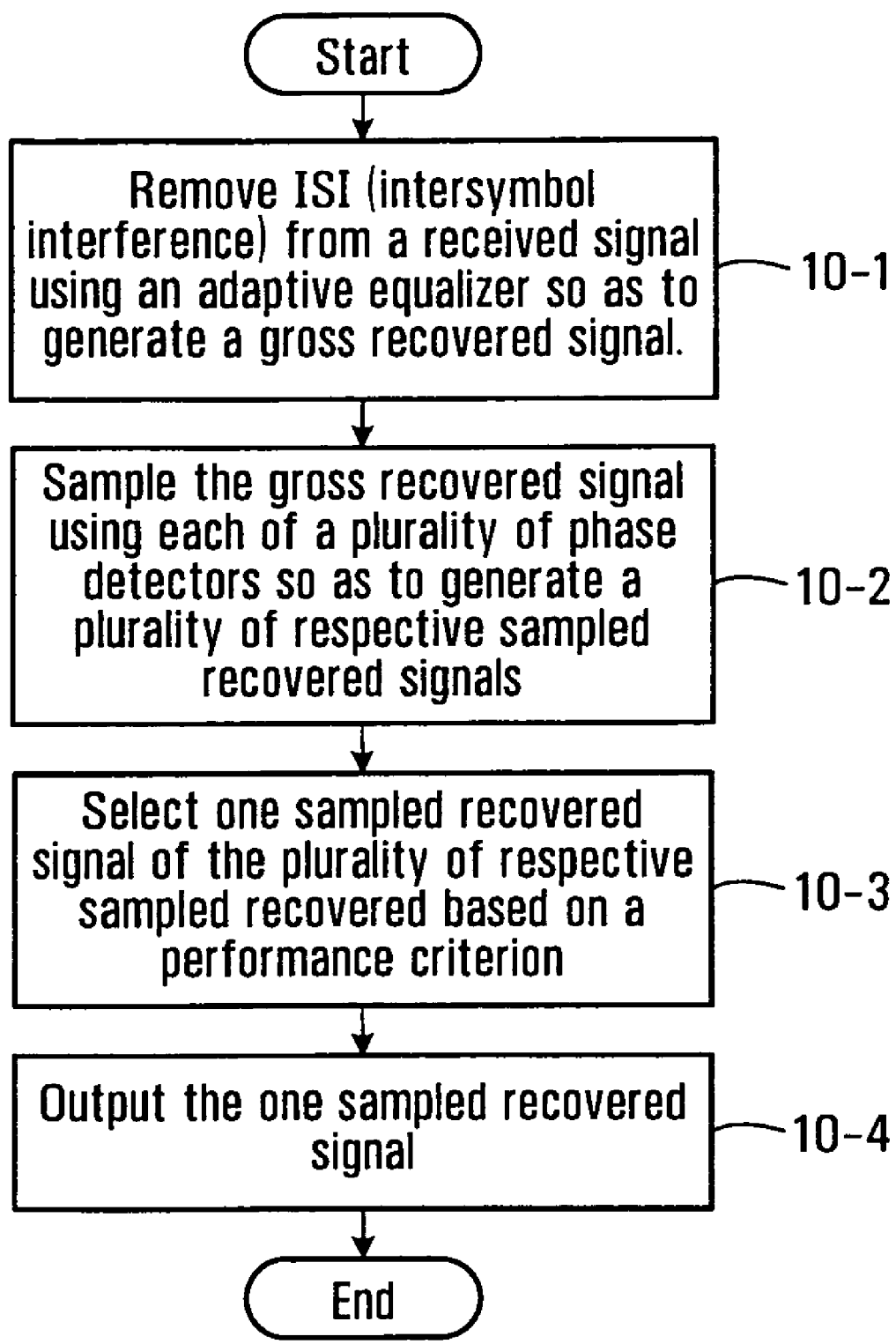
FIG. 10 is a flowchart of another method of recovering data received over a communication channel.

Referring now to FIG. 10, shown is a flowchart of another method of recovering data received over a communication channel. This method may be implemented by any appropriately configured circuit, for example the circuit 80 shown in FIG. 9. At step 10-1, the circuit removes ISI (intersymbol interference) from a received signal using an adaptive equalizer so as to generate a gross recovered signal. At step 10-2, the circuit samples the gross recovered signal using each of a plurality of phase detectors so as to generate a plurality of respective sampled recovered signals. At step 10-3, the circuit selects one sampled recovered signal of the plurality of respective sampled recovered signals based on a performance criterion, examples of which have been provided above. At step 10-4, the circuit outputs the one sampled recovered signal.

Numerous modifications and variations of the present application are possible in light of the above teachings. It is therefore to be understood that within the scope of the appended claims, the application may be practised otherwise than as specifically described herein.

We claim:

1. A circuit for recovering data received over a communication channel, the circuit comprising:
   an adaptive equalizer operable to remove ISI (intersymbol interference) from a received signal so as to generate a gross recovered signal; and
   a timing recovery circuit comprising a plurality of phase detectors, each operable to sample the gross recovered signal, generate a phase error between the gross recovered signal and a clock, and generate a respective sampled recovered signal using a plurality of latches receiving the clock that is adjusted according to the phase error, wherein a last one of the plurality of latches has an output for generating the sampled recovered signal; and
   a signal selector operable to select any one respective sampled recovered signal based on a performance criterion, the one respective sampled recovered signal being selected as an output of the circuit;
   wherein the performance criterion is SNR (Signal to Noise Ratio) of each selectable sampled recovered signal, the one sampled recovered signal being selected as having a greater SNR than all other selectable sampled recovered signals.

2. The circuit of claim 1 wherein the adaptive equalizer is further operable to generate an error signal, the circuit further comprising:
   a signal processing element implementing an algorithm to minimize the error signal by generating feedback for the adaptive equalizer.

3. The circuit of claim 2 wherein the signal processing element comprises a DSP (Digital Signal Processor).

4. The circuit of claim 2 wherein the algorithm is based on an LMS (Least Mean Square) algorithm.

5. The circuit of claim 2 wherein the feedback comprises at least one set of coefficients for use by the adaptive equalizer.

6. The circuit of claim 5 wherein the at least one set of coefficients comprises a first set of coefficients and a second set of coefficients, the adaptive equalizer comprising:
   a feed-forward equalizer using the first set of coefficients and the received signal to generate a feed-forward signal; and
   a decision feedback equalizer using the feed-forward signal and the second set of coefficients to generate the gross recovered signal.

7. The circuit of claim 6 wherein the feed-forward equalizer comprises:
   at least one analog delay element operable to generate at least one time-delayed signal of the received signal;
   a plurality of multipliers including a first multiplier and at least one additional multiplier, the first multiplier being operable to generate a first multiplied signal by multiplying the received signal with a first coefficient of the first set of coefficients, each additional multiplier being operable to generate a respective multiplied signal by multiplying a respective one of the at least one time-delayed signal with a respective one of the first set of coefficients; and
   a summation element operable to generate the feed-forward signal by summing the first multiplied signal with each respective multiplied signal.

8. The circuit of claim 7 wherein the feed-forward equalizer is a fractional feed-forward equalizer, each analog delay element being a fractional analog delay element.

9. The circuit of claim 6 wherein the decision feedback equalizer comprises:
   a first summation element operable to generate a raw recovered signal by summing the feed-forward signal with each of a plurality of multiplied signals;
   a threshold element operable to threshold the raw recovered signal thereby generating the gross recovered signal;
   a plurality of clocked flip-flops operable to generate a plurality of time-delayed signals from the gross recovered signal; and
   a plurality of multipliers, each multiplier being adapted to generate a respective one of the plurality of multiplied signals by multiplying a respective one of the plurality of time-delayed signals with a respective one of the second set of coefficients.

10. The circuit of claim 9 wherein the adaptive equalizer further comprises:
    a second summation element operable to generate the error signal by summing the raw recovered signal with the gross recovered signal.

11. The circuit of claim 1 wherein one of the detectors is based on a Hogge Phase detector and comprises:
    a plurality of clocked latches connected in series, a first one of the plurality of clocked latches having an input for accepting the gross recovered signal, a last one of the plurality of clocked latches having an output for generating the sampled recovered signal;
    wherein the plurality of clocked latches is operable to sample the gross recovered signal from the adaptive equalizer so as to generate the sampled recovered signal at the output of the last one of the plurality of clocked latches.

12. The circuit of claim 11 wherein the plurality of clocked latches is three clocked latches.

13. The circuit of claim 12 wherein the detector based on the Hogge Phase detector consists of the plurality of clocked latches, the plurality of clocked latches consisting of three clocked latches.

14. The circuit of claim 11 further comprising a charge pump, the charge pump comprising:
    a first input for accepting the gross recovered signal from the adaptive equalizer;
    at least one subsequent input, each subsequent input being connected to a respective output of each clocked latches starting with a second clocked latches; and
    an output for driving a filter thereby generating a phase error signal, the phase error signal providing a feedback signal for the detector based on the Hogge Phase detector.

15. The circuit of claim 1 wherein one of the detectors is based on a Mueller and Muller phase detector.

16. The circuit of claim 1 wherein the performance criterion is BER (Bit Error Rate) of each selectable sampled recovered signal, the one sampled recovered signal being selected as having a smaller BER than all other selectable sampled recovered signals.

17. A module comprising:
  a receiver operable to receive data over a communication channel;
  a circuit according to claim 1 operable to recover and sample the data; and
  an electrical interface operable to interface the module with some other circuit.

18. The module of claim 17 wherein the receiver is a laser receiver.

19. The module of claim 18 further comprising:
  a laser source operable to transmit a laser signal over a fibre channel.

20. A method for recovering data received over a communication channel, the method comprising:
  removing ISI (intersymbol interference) from a received signal using an adaptive equalizer so as to generate a gross recovered signal;
  sampling the gross recovered signal using a plurality of phase detectors each operable to sample the gross recovered signal, generate a phase error between the gross recovered signal and a clock, and generate a respective sampled recovered signal using a plurality of latches receiving the clock that is adjusted according to the phase error, wherein a last one of the plurality of latches has an output for generating the sampled recovered signal;
  selecting any one sampled recovered signal of the plurality of respective sampled recovered signals based on a performance criterion; and
  outputting the one sampled recovered signal;
  wherein the performance criterion is SNR (Signal to Noise Ratio) of each selectable sampled recovered signal, the one sampled recovered signal being selected as having a greater SNR than all other selectable sampled recovered signals.

21. A circuit for recovering data received over a communication channel, the circuit comprising:
  an adaptive equalizer operable to remove ISI (intersymbol interference) from a received signal so as to generate a gross recovered signal at an output;
  a timing recovery circuit comprising a plurality of phase detectors, each phase detector being coupled to the output of the adaptive equalizer and being operable to sample the gross recovered signal, generate a phase error between the gross recovered signal and a clock, and generate a respective sampled recovered signal using a plurality of latches receiving the clock that is adjusted according to phase error, wherein a last one of the plurality of latches has an output for generating the sampled recovered signal; and
  a signal selector operable to select, based on a performance criterion, any one of the phase detectors to generate an output for the circuit by sampling the gross recovered signal;
  wherein the performance criterion is based on an SNR (Signal to Noise Ratio).

22. The circuit of claim 21, wherein the plurality of phase detectors comprises:
  a first detector based on a Hogge Phase detector; and
  a second detector based on a Mueller and Muller phase detector.

* * * * *